United States Patent
Speckels et al.

(10) Patent No.: US 8,209,858 B2
(45) Date of Patent: Jul. 3, 2012

(54) METHOD FOR MOUNTING ELECTRONIC COMPONENTS ON A SUPPORT

(75) Inventors: Roland Speckels, Kamen (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 867 days.

(21) Appl. No.: 11/627,719

(22) Filed: Jan. 26, 2007

(65) Prior Publication Data

US 2007/0175021 A1    Aug. 2, 2007

(30) Foreign Application Priority Data

Jan. 26, 2006   (DE) .................... 10 2006 003 735

(51) Int. Cl.
*H05K 13/04* (2006.01)

(52) U.S. Cl. ............ 29/834; 29/739; 29/740; 29/741; 29/832; 228/6.2; 228/49.5; 228/180.1; 228/180.21; 228/180.22

(58) Field of Classification Search ............ 29/739–741, 29/743, 832, 834; 228/6.2, 49.5, 180.1, 180.21, 228/180.22
See application file for complete search history.

(56) References Cited

U.S. PATENT DOCUMENTS

| | | | | |
|---|---|---|---|---|
| 4,875,614 A | * | 10/1989 | Cipolla et al. | 228/5.5 |
| 4,896,811 A | * | 1/1990 | Dunn et al. | 228/5.5 |
| 6,509,206 B2 | | 1/2003 | Iwasaki et al. | 438/107 |
| 6,544,377 B1 | | 4/2003 | Minamitani et al. | 156/299 |

FOREIGN PATENT DOCUMENTS

| | | |
|---|---|---|
| DE | 10133244 A1 | 6/2002 |
| JP | 09326422 A  * | 12/1997 |
| JP | 09326422 A | 12/1997 |

OTHER PUBLICATIONS

German Office Action for German Patent Application No. 10 2006 003 735.9 (4 pages), Jan. 26, 2006.

* cited by examiner

*Primary Examiner* — Livius R Cazan
(74) *Attorney, Agent, or Firm* — Murphy, Bilak & Homiller, PLLC

(57) ABSTRACT

An arrangement for mounting a multiplicity of components (9, 10), particularly with irregular surface topography, on a support (7) using an assembly tool which has a tool substructure (5) and a tool superstructure (6), where the tool substructure (5) is designed to receive the support and the components which are to be mounted thereon, and the tool superstructure (6) has, in addition to an arrangement (11, 12) for transmitting assembly forces, an arrangement for compensating for tilts between the components and the support and/or an arrangement for compensating for irregular surface topologies.

10 Claims, 2 Drawing Sheets

METHOD FOR MOUNTING ELECTRONIC COMPONENTS ON A SUPPORT

RELATED APPLICATION

This application claims priority from German Patent Application No. DE 10 2006 003 735.9, which was filed on Jan. 26, 2006, and is incorporated herein by reference in its entirety.

TECHNICAL FIELD

The invention relates to an arrangement for tilt-free mounting of electronic components, particularly large-area semiconductor bodies with irregular surface topography, by means of assembly on a substrate without abrading the assembly tool used for assembly.

BACKGROUND

To mount electronic components, particularly large-area semiconductor bodies, the prior art involves the application of different assembly methods. The material-joining assembly techniques on which these assembly methods are based include welding, soldering, sintering and bonding, for example. Through the further development of conventional methods and the development of new methods, assembly engineering has been able to be matched to the increasing demands of modern products, particularly including microelectronics, and the spectrum of application has been able to be continually expanded. The particular significance of assembly engineering for the product properties which are to be attained is based on the need for the joints to meet demands which correspond to the functional properties of the assembly parts. In particular, this also requires assembly-compliant design and optimized precision and also durability of the tools used in the assembly methods.

For producing joints, the prior art typically involves the application of pressure- and temperature-controlled connection techniques, such as die bonding, low-temperature connection technique or diffusion soldering (see EP 1030349, EP 0790647, U.S. Pat. No. 6,727,587, DE 19531158, EP 275433, EP 242626, EP 330895, U.S. Pat. No. 5,379,942, for example).

In this case, a permanent and heat-resistant metal connecting layer is formed between the electronic component and a substrate by means of assembly with the application of a high pressure and a temperature which is dependent on the method applied. To this end, a solder or sinter material is applied prior to the assembly operation either on the substrate or on the side of the electronic component. Examples of possible methods for applying such a layer are dispensing, sputtering, vapor deposition, screen printing or spraying processes. The components prepared in this manner are then placed on top of one another with an exact fit in the assembly operation and are connected to one another by means of a statically applied pressure and an assembly temperature. In this case, the solder or sinter layer is converted into a usually high-melting-point connecting layer between the electronic component and the substrate. Through the formation of intermetal phases, this layer produces a nondeformable connection between the substrate and the electronic component.

During diffusion soldering, metal atoms of the solder diffuse into the workpiece and conversely from the workpiece into the solder. This produces an alloy zone. A prerequisite for diffusion soldering is that the metals used are miscible. The diffusion is heavily temperature-dependent, that is to say the higher the soldering temperature the higher the degree of diffusion and the broader the alloy zone, with a high degree of diffusion having a correspondingly positive effect on the strength values of the connection, such as shear strength.

Besides the electronic functions, a joint between an electronic component and the substrate also needs to have the property of being a good dissipater of the heat produced on an electronic component and of absorbing thermomechanical stresses, for example. In the case of electronic components such as power semiconductors, the demands relating to these properties are particularly high. Thus, a modern IGBT (Insulated Gate Bipolar Transistor) turns off at 1.7 kV, for example, and can have a charging current of 75 A at an on-state voltage of 3.8 V. When the switching losses are additionally taken into account, it must be possible in typical use to dissipate a power loss of around 500 W in the form of heat.

The electronic component itself, which in this case is a source of heat, has a size of only about 1.3 cm×1.3 cm, for example. The electronic component and the materials surrounding this component need to be able to withstand a constant change of temperature from low ambient temperatures down to −55° Celsius, for example, and operating temperatures up to approximately +150° Celsius. These high demands cannot be met by all connection techniques which are customary on the basis of the prior art, which is why in these cases the method known as low-temperature connection technique is used. This method is based on the pressure-sintering of particular silver powders at a low temperature, in comparison with other methods, of approximately 250° Celsius and a moderate pressure of approximately 40 MPa for an action time of approximately 3 minutes. The areas to be connected need to be metallized with gold or silver, for which the aforementioned dispensing, sputtering, vapor deposition, screen printing or spraying methods are used.

In the course of this method, a very stable, sponge-like connecting layer with a high level of resistance to heat and electrical conductivity is produced between the electronic component and the substrate. The advantages of this connection technique over other methods such as soldering and bonding are, inter alia, the absence of a liquid phase during the operation itself, since this involves a solid-state reaction, high strength even above the process temperature (around 250° Celsius), a bubble-free connecting layer, greatly reduced thermomechanical stresses, high load change strength and high electrical and thermal conductivity.

Since all the methods applied on the basis of the prior art involve the thickness of the connecting layer which is to be formed between the electronic components and a substrate being in the micron range, plane-parallel orientation of the surfaces which are to be connected relative to one another is crucial to the success and quality of the connection attained. In addition, many of the electronic components used today on the basis of the prior art have a surface topography which makes the even introduction of force into the surface of these components more difficult. For this reason, the prior art involves the use of plastics in conjunction with assembly tools, so as not to damage the components during the assembly operation.

In this case, these plastics are intended, by virtue of their elasticity, to be able to compensate for tilts and irregular surface topographies of electronic components to a limited degree. One example of this is the use of a silicone cushion for the aforementioned low-temperature connection technique. Such a method is described in the laid-open specification EP 330895, for example. This describes the pressure sintering of components with a patterned surface topography, the electronic components being placed, together with a body made of elastically deformable material, for example silicone rubber, into a receiving chamber which is closed off by a movable die and which transmits the sinter pressure. In this context, upon the sinter pressure being reached, the deformable body fills the remaining interior of the receiving chamber completely and, despite an irregular surface topography of the components which are to be connected to the substrate, is intended to apply the pressure required for the assembly operation nondestructively.

The advantages of using elastic assembly tools, such as the possibility of compensating for a patterned surface topography, are restricted by the fact that there is a lack of long-term stability in these plastic materials, however. One disadvantageous effect in this context is that particularly the influence of the assembly temperatures, which may be up to 400° Celsius depending on the method used, and the influence of mechanical abrasion in the course of the lifetime of such an assembly tool result in a decrease in elasticity and permanent deformation of the surface.

This means increased abrasion of the assembly tool and hence continuous alteration of the assembly parameters in the course of making large numbers of connections between components and the substrate, which means that it is not possible to observe constant and reproducible production and quality parameters during the production process. In addition, with flexible materials such as silicone cushions, tilts in the surfaces between the component which is to be connected to the substrate and the substrate can be compensated for only inadequately.

SUMMARY

According to an embodiment, an arrangement for mounting a multiplicity of components on a support by means of assembly may use an assembly tool which has a tool substructure and a tool superstructure, wherein the tool substructure is designed to receive the support and the components which are to be mounted thereon, and the tool superstructure has, in addition to an arrangement for transmitting assembly forces, an arrangement for compensating for tilts between the components and the support and/or an arrangement for compensating for irregular surface topologies.

BRIEF DESCRIPTION OF THE DRAWINGS

The invention is explained in more detail below with reference to the exemplary embodiments shown in the figures of the drawing, where identical elements are provided with the same reference symbols and in which.

DETAILED DESCRIPTION

Figure 1:
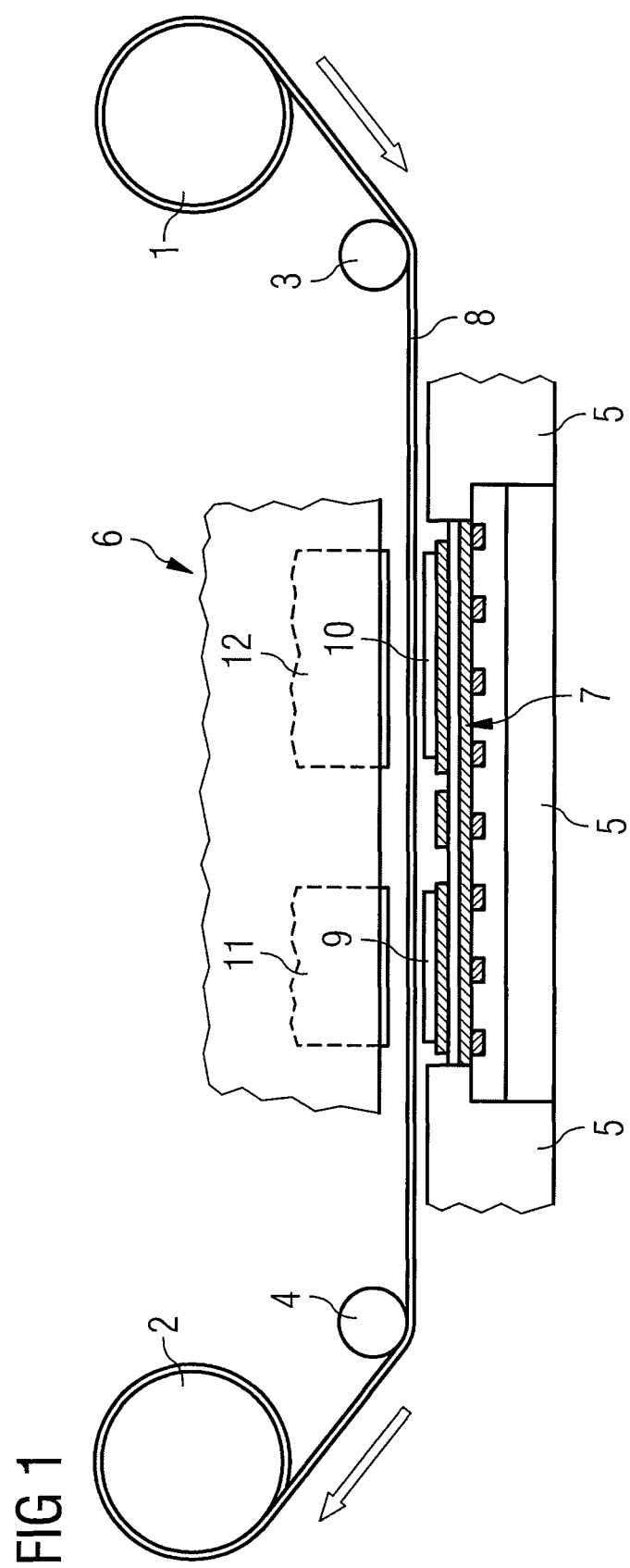
FIG. 1 shows an exemplary embodiment of an assembly apparatus.

According to the embodiments, the fundamental functions of the assembly tool are split into separately implemented sub-arrangements. Specifically, these are a sub-arrangement for the transmission of force and a sub-arrangement for compensating for irregular surface topographies in the components which are to be connected to the support and/or a sub-arrangement for compensating for tilts between the components which are to be connected to the support and the support.

An embodiment for mounting a large number of components, particularly with irregular surface topography, on a support by means of assembly, thus, comprises an assembly tool which has a tool substructure and a tool superstructure, the tool substructure being designed to receive the support and the components which are to be mounted thereon and the tool superstructure having, in addition to an arrangement for transmitting assembly forces, an arrangement for compensating for tilts between components and support and/or an arrangement for compensating for irregular surface topologies.

Advantageous effects, according to different embodiments, arise from the implementation of the arrangement which transmits the assembly force particularly as a nondeformable and abrasion-free subarrangement of the assembly tool (for example made of metal or cedieic), the implementation of the assembly tool's subarrangement which compensates for the surface topography of the electronic components as a flexible film which has a microhardness matching the surface topography of the electronic components and which is renewed upon every single assembly process, and from the implementation of the assembly tool's subarrangement for compensating for the tilts particularly as a universal joint.

According to different embodiments, provision can be made for a multiplicity of assembly tools, which are appropriately matched to different electronic components which are to be mounted, for example as regards size, geometry and assembly force, to be used for simultaneously mounting a multiplicity of electronic components on the support in one work step, with each individual assembly tool being able to have a separate universal joint for compensating for individually different tilts between the multiplicity of components which are to be connected to the support and the support.

According to an embodiment, provision may also be made for the flexible film used for compensating for irregular surface topographies in the multiplicity of components which are to be connected to the support to be applied as a cohesive film, having the same material property, in one piece regardless of the positioning and size of the components over all the components and hence in one work step over the entire area of the support to which the components are to be fitted.

According to an embodiment, further advantages may likewise arise from the fact that the renewal of the flexible film for compensating for irregular surface topographies in the components which are to be connected to the support takes place for each new production step of fitting components to the substrate by virtue of supply via a supplying apparatus which is decoupled from the rest of the assembly tool, for example a spool, which means that this film does not need to be fitted to the assembly tool itself, which is always time-consuming.

FIG. 1 shows an embodiment of an assembly apparatus in a side view, the applied assembly process being able to be die bonding, low-temperature connection technique or diffusion soldering, for example. In this case, the exemplary embodiment shown in FIG. 1 comprises a first spool 1, a second spool 2, a first spring-mounted tension roller 3 and a second spring-mounted tension roller 4. In addition, the exemplary embodiment shown in FIG. 1 comprises a tool substructure 5, a tool superstructure 6 and a flexible film 8. The exemplary embodiment shown in FIG. 1 also comprises a first electronic component 9 and a second electronic component 10, a substrate 7 as a support and also a first arrangement for force transmission 11 and a second arrangement for force transmission 12.

The first spool 1 and the second spool 2 in this arrangement are apparatuses for unwinding and winding the flexible film 8, with the first spring-mounted tension roller 3, situated between the tool and the spool 1, together with the second spring-mounted tension roller 4, situated between the tool and the spool 2, producing a tensile stress in the flexible film 8 along the transport path of the flexible film 8. In this case, the spool 1 is the apparatus for supplying unused flexible 8, and the spool 2 is the apparatus for receiving used flexible film 8. The tool is made up of the tool substructure 5 and the tool superstructure 6. The tensile stress produced in the flexible film 8 by the tension roller 3 and the tension roller 4 ensures that the flexible film 8 unwound from the spool 1 in FIG. 1 is guided into the tool and through the tool in the direction of the arrow between the tool substructure 5 and the tool superstructure 6 such that smooth and trouble-free transport through the tool is made possible.

In particular, this ensures that the flexible film 8 does not get jammed ahead of or in the tool and does not hold up the production process or that unwanted folds do not form in the film 8 during transport. The positioning of the two spring-mounted tension rollers 3 and 4 ensures that the flexible film 8 is guided horizontally through the tool when the tool is open, without touching the tool substructure 5 or the tool superstructure 6, which minimizes the risk of unwanted damage to the flexible film during transport. The tool substructure 5 shown in FIG. 1 is used to receive the substrate 7 which is to be connected to the electronic components 9 and 10 and, at the same time, as an outer support for the pressure exerted by the tool superstructure 6 during the assembly operation. In the present case, the finished component then comprises the substrate 7, on which the electronic components 9 and 10 are permanently mounted by the assembly operation, for example.

In this case, the flexible film 8 is used, according to an embodiment, to compensate for irregular surface topographies in the electronic components 9 and 10 which are to be connected to the substrate 7, said components in the embodiment of a respective separate arrangement 11 and 12 for force transmission shown in FIG. 1 having pressure applied to them by the assembly tool, with the transmission of force also possibly being produced by an individual, large-area arrangement for transmitting force. According to an embodiment, the assembly tool shown in FIG. 1 may comprise a multiplicity of arrangements for transmitting force, which makes it possible to mount a multiplicity of electronic components on the substrate 7 in a single work step.

According to an embodiment, the flexible film 8 is produced from an elastic, inert material such as PTFE, polyimide or an elastomer which has a microhardness matching the surface topography of the components 9 and 10. PTFE (polytetrafluoroethylene) is distinguished by several properties which are advantageous for the application described. PTFE is very inert and hence extremely resistant, for example toward aggressive acids, toward bases, alcohols, fuels, oils etc. In addition, PTFE has a very low coefficient of friction and is difficult to ignite.

Polyimides are, in particular, very insensitive to temperature and have special electrical and mechanical properties, which is why they are also often used in air and space engineering. Elastomers, like PTFE and polyimides, can deform under tensile and compressive loading and are therefore a suitable material for ideally compensating for the irregular surface topographies of the electronic components 9 and 10 which are to be connected to the substrate 7 and are shown in the example in FIG. 1 and for allowing an even action of force on the electronic components 9 and 10 during the assembly operation. Depending on the absolute order of magnitude of the irregularities in the surface topographies of the components, different material thicknesses can be selected for the flexible film 8 used, in order to match the compensation for the irregularities to the given conditions in optimum fashion in each case.

According to an embodiment, the flexible film 8 is renewed after each individual assembly operation which has taken place, which covers all the components which are to be mounted on the substrate, that is to say that the flexible film 8 wound onto the spool 1 in the form of a long film tape is transported in steps from the supply roller (spool 1) via the spring-mounted tension roller 3 through the tool comprising the tool substructure 5 and the tool superstructure 6 via the spring-mounted tension roller 4 onto the empty roller (spool 2). The flexible film 8 is transported at a time after a current assembly operation has ended, when the tool is opened in order to remove the finished component produced from the substrate 7 and the electronic components 9 and 10, to which end the tool substructure 5 and the tool superstructure 6, which are closed during the assembly operation, are opened.

In this case, the film 8 is moved in steps by a transport mechanism (not shown here) such that for each assembly operation a completely new film section is provided. Hence, an unused film segment is used for each assembly operation and it is always possible to ensure constant film properties and hence constant compensation for the irregularities in the surface topographies of the components. Preferably, the width of the film tape comprising the flexible film 8 is chosen such that the entire area of the component (e.g. module) to be processed, comprising the substrate 7 and the electronic components 9 and 10, is covered in one work step, as a result of which a separate region of respectively unused flexible film 8 is available for each of the multiplicity of the electronic components which are to be mounted. In this case, the method shown in FIG. 1 is independent of whether the assembly tool comprises a multiplicity of arrangements for transmitting force to a multiplicity of semiconductor components which are to be mounted or a single arrangement for transmitting force to a multiplicity of semiconductor components.

Hence, constant and reproducible production and quality parameters are produced even when mounts are produced for electronic components on a support (e.g. substrate) in large numbers. In addition, it is another advantage that during an ongoing production process it is not necessary to make any changes to the apparatuses for compensating for the irregularities in the surface topographies of components directly on the assembly tool itself, which means that component fitting times and hence downtimes during production can be severely reduced. Any flexible film used is replaced easily and quickly by appropriately changing the supply roller and the takeup roller (spool 1 or spool 2). Even changing to another film thickness in connection with a production series using electronic components with other surface topographies can be done quickly.

Figure 2:
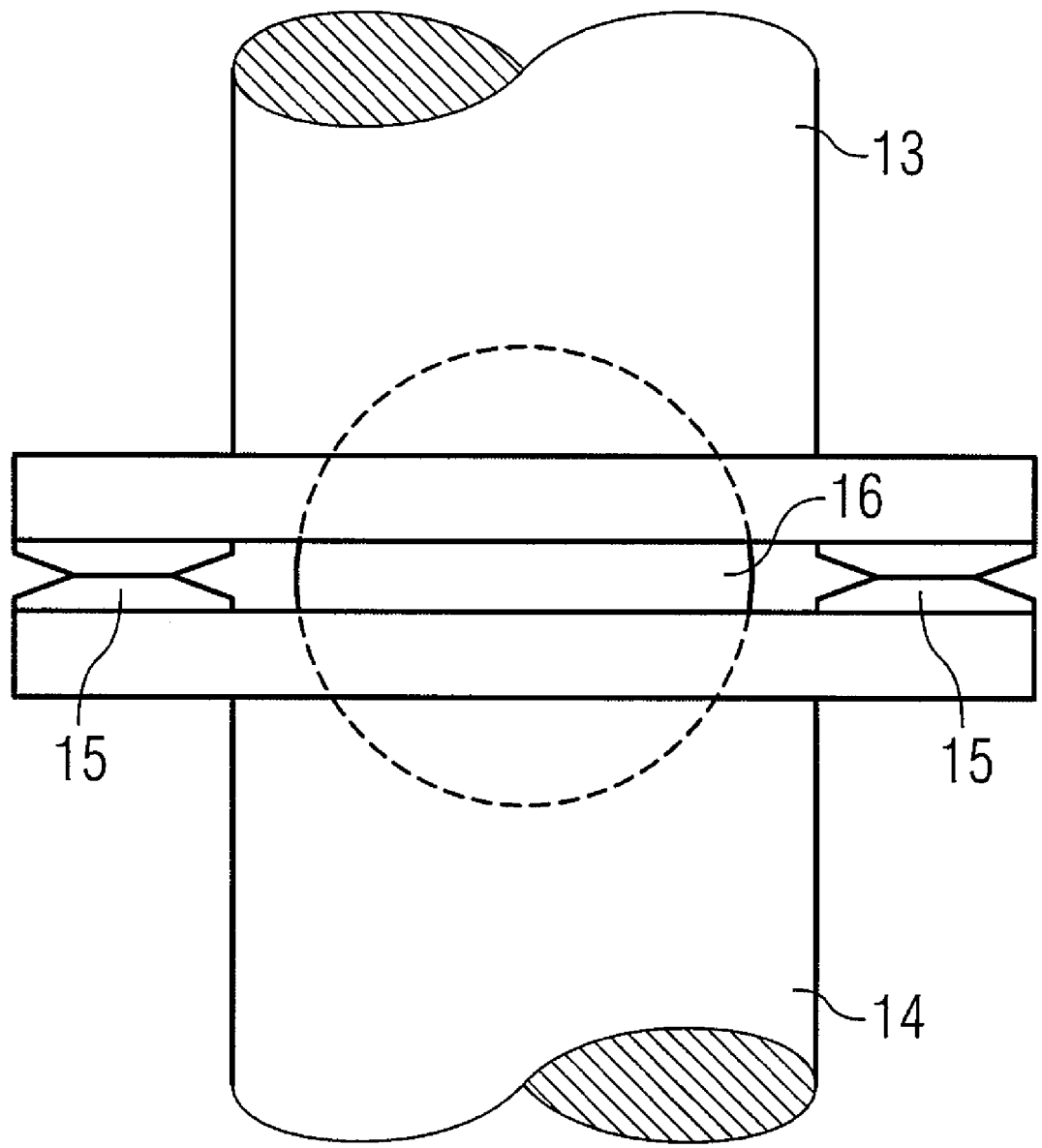
FIG. 2 shows a subarrangement of the assembly tool for force transmission with a universal joint.

FIG. 2 shows a side view of an embodiment of one of the arrangements 11 and 12 (e.g. die) for transmitting force to the electronic component which is to be mounted on the substrate. In this case, FIG. 2 comprises a die upper part 13, a die lower part 14, restoring spring elements 15 and a ball bearing 16. The die upper part 13 and the die lower part 14 in this arrangement, together with the ball bearing 16, form a universal joint. The universal joint in the embodiment shown is distinguished particularly by the fact that it compensates for possible tilts between the electronic component (9, 10) and the substrate 7 through an appropriate change of angle in the universal joint and at the same time transmits the force required for the assembly operation via the large contact area between the ball bearing 16 and the die upper part 13 and the die lower part 14.

The position of the electronic component (9, 10) relative to the substrate 7 and also the orientation of the substrate surface itself are therefore decoupled from the initial orientation of the die shown in FIG. 2 and are independent within the context of the possible orders of magnitude of the tilts which occur. In this case, the die upper part 13 retains its orientation in the tool for the transmission of force and the die lower part 14 matches its orientation to the respective tilt occurring between the component (9, 10) and the substrate 7 and also to the orientation of the respective surface topography of the electronic component (9, 10). In this way, constant assembly parameters are permanently assured for each assembly operation, even for the transmission of force.

The restoring spring elements 15 likewise shown in FIG. 2 ensure that the die shown in FIG. 2 returns to its original starting position, namely to the orientation along the longitudinal axis and hence along the action of force by the die upper part 13, for example, after the assembly operation has taken place and the assembly apparatus shown in FIG. 1 has subsequently been opened, for example by lifting the tool superstructure 6 from the tool substructure 5.

The assembly tools used to date on the basis of the prior art can compensate for tilts between components which are to be connected to one another, such as a substrate and electronic components which are to be mounted thereon, and also for the influences of irregular surface topographies only inadequately and, furthermore, ensure only inadequate long-term stability at the usual process temperatures of up to 400° Celsius.

It can be seen that both the problems of tilting and surface topography and of long-term stability can be solved according to different embodiments particularly through suitable combination of the arrangements shown in FIG. 1 and FIG. 2 and using assembly methods which are particularly suitable therefore. In this case, it is possible, in particular, to use the different embodiments of the arrangement for force transmission generally in any apparatus in which a die needs to be used to exert even pressure on an object and its surface. If the surface of such a general object also has an irregular topography then it may also be correspondingly advantageous to use the illustrated method for compensating for this topography through a flexible, inert film of appropriate thickness.

LIST OF REFERENCE SYMBOLS

1 Spool for supplying the flexible film
2 Spool for receiving used film
3 Spring-mounted tension roller
4 Spring-mounted tension roller
5 Tool substructure
6 Tool superstructure
7 Component
8 Flexible film
9 Electronic component
10 Electronic component
11 Arrangement for transmitting force
12 Arrangement for transmitting force
13 Die upper part
14 Die lower part
15 Restoring spring elements
16 Ball bearing

What is claimed is:

1. A method for mounting a multiplicity of semiconductor components on a support substrate by means of assembly, comprising the steps of:
    using an assembly tool which has a tool substructure and a tool superstructure,
    receiving the support substrate and the multiplicity of semiconductor components by the tool substructure so that the multiplicity of semiconductor components are interposed between the tool superstructure and the support substrate,
    simultaneously compensating for tilts between the multiplicity of semiconductor components and the support substrate by a first sub-arrangement of the tool superstructure,
    simultaneously compensating for irregular surface topologies on the multiplicity of semiconductor components by a second sub-arrangement of the tool superstructure different than the first sub-arrangement, and
    simultaneously mounting the multiplicity of semiconductor components on the same side of the support substrate,
    wherein the tool superstructure comprises a die in an arrangement for force transmission having a die upper part, a die lower part, a ball bearing and restoring spring elements which form a universal joint such that tilts between the multiplicity of semiconductor components which are to be mounted on the support substrate and the support substrate are compensated for upon the action of force via the die through an appropriate change of angle in the universal joint and at the same time the force required for the assembly operation is reliably transmitted by means of contact areas between the ball bearing and the die upper part and the die lower part.

2. The method according to claim 1, comprising the step of transmitting assembly forces by the die which presses indirectly against the multiplicity of semiconductor components.

3. The method according to claim 1, wherein the second sub-arrangement of the tool superstructure is a flexible film which, during the assembly operation, is situated between the components and the die.

4. The method according to claim 3, wherein the flexible film has a microhardness and a heat-resistance suitable for matching the surface topographies of the components which are to be mounted on the support and the temperatures applied during the assembly operation.

5. The method according to claim 3, wherein the flexible film has a variable material thickness so as to match different surface topographies of the components which are to be mounted on the support.

6. The method according to claim 3, wherein the flexible film is a film tape and a transport arrangement is provided which, prior to each assembly operation, conveys the film tape over the die of the assembly tool exerting the assembly force such that unused film is available for each assembly operation.

7. The method according to claim 6, wherein the film tape is introduced afresh, via a spring-mounted tension roller by a spool for supplying unused film, upon each assembly operation, in steps, between the surface of the components which are to be mounted on the support and the die of the assembly tool exerting the assembly force and is picked up via a spring-mounted tension roller by a spool for receiving used film, so that a film segment of unused flexible film is available for each assembly operation.

8. The method according to claim 6, wherein the film tape is of a width such that all the components which are to be mounted on the support come into contact with the unused film to the same extent in each assembly operation.

9. The method according to claim 1, wherein the restoring spring elements are arranged and in a form such that following an assembly operation and subsequent opening of the assembly tool by lifting the tool superstructure from the tool substructure they return the entire die to its original starting position again.

10. The method according to claim 9, wherein in the original starting position the orientation of the die upper part and the die lower part is along the common longitudinal axis and hence along the vector of the action of force from the die upper part.

* * * * *